United States Patent
Wu et al.

(10) Patent No.: US 6,287,950 B1
(45) Date of Patent: Sep. 11, 2001

(54) BONDING PAD STRUCTURE AND MANUFACTURING METHOD THEREOF

(75) Inventors: Jyh-Ren Wu, Taipei; Chia-Chen Liu, Hsinchu, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/535,509

(22) Filed: Mar. 24, 2000

(30) Foreign Application Priority Data

Feb. 3, 2000 (TW) ................................. 089101951

(51) Int. Cl.⁷ ................................. H01L 21/44
(52) U.S. Cl. ................................. 438/612; 438/617
(58) Field of Search ................... 438/587, 612, 438/617, 621, 623, 615, 665, 666, 669, 672

(56) References Cited

U.S. PATENT DOCUMENTS

| | | | |
|---|---|---|---|
| 4,628,590 | * 12/1986 | Udo et al. | 29/575 |
| 5,731,243 | * 3/1998 | Peng et al. | 438/612 |
| 5,807,787 | * 9/1998 | Fu et al. | 438/623 |
| 6,060,378 | * 5/2000 | Rolfson | 438/612 |
| 6,200,889 | * 3/2001 | Rolfson | 438/612 |

* cited by examiner

Primary Examiner—David Nelms
Assistant Examiner—Phuc T. Dang
(74) Attorney, Agent, or Firm—Jiawei Huang; J. C. Patents

(57) ABSTRACT

A bonding pad structure and its method of manufacture. The structure has a metallic bonding pad with a patterned surface, a first passivation layer having an opening above the metallic bonding pad and a second passivation layer over the first passivation layer also having an opening above the metallic bonding pad. The method of forming the bonding pad structure includes forming a metallic bonding pad over a substrate, and then forming a first passivation layer over the substrate and the bonding pad. The first passivation layer above the bonding pad is patterned. Using the first passivation layer as a mask, a portion of the exposed metal pad material is removed. A patterned second passivation layer is formed over the first passivation layer. The second passivation layer has an opening that exposes the bonding pad. Finally, residual material from the first passivation layer inside the bonding pad region is removed to expose the bonding pad surface.

20 Claims, 4 Drawing Sheets

BONDING PAD STRUCTURE AND MANUFACTURING METHOD THEREOF

CROSS-REFERENCE TO RELATED APPLICATION

This application claims the priority benefit of Taiwan application serial no. 89101951, filed Feb. 3, 2000.

BACKGROUND OF THE INVENTION

1. Field of Invention

The present invention relates to an integrated circuit device structure and a manufacturing method thereof. More particularly, the present invention relates to a bonding pad structure and a manufacturing method thereof.

2. Description of Related Art

As semiconductor technologies continue to advance, deep submicron devices are now routinely manufactured. Due to a reduction in feature size, many formerly minor technical problems now become prominent and demand special consideration. For example, quality of connection between a bonding pad and a bonding wire can seriously affect the reliability of a device.

As dimensions of a device shrink, contact area between a conductive wire and a bonding pad is reduced correspondingly. Hence, when a wire is attached to a bonding pad, the bonding pad has to support a larger stress. Furthermore, adherence of the bonding wire to the bonding pad is likely to drop due to a smaller junction area. In general, a conventional bonding pad has a very flat surface. FIG. 1A is a cross-sectional side view of a conventional bonding pad. As shown in FIG. 1A, the bonding pad 110 is formed over a substrate 100. A passivation layer 120 is formed over the substrate 100 and the peripheral region of the bonding pad 110.

FIG. 1B is a cross-sectional side view of a conventional bonding pad 110 with a bonding wire 150 attached to the bonding pad surface. In general, contact area between a conductive wire and a bonding pad in a highly integrated circuit chip is very small. Therefore, the conductive wire can be easily pulled off causing low production yield.

SUMMARY OF THE INVENTION

Accordingly, one object of the present invention is to provide a bonding pad structure and a method of forming the bonding pad structure on a substrate for increasing contact area and hence adherence with a conductive wire.

To achieve these and other advantages and in accordance with the purpose of the invention, as embodied and broadly described herein, the invention provides a bonding pad structure. The structure includes a metallic bonding pad with a patterned surface, a first passivation layer having an opening above the metallic bonding pad and a second passivation layer over the first passivation layer also having an opening above the metallic bonding pad.

The invention also provides a method of forming the bonding pad structure. First, a metallic bonding pad is formed over a substrate, and then a first passivation layer is formed over the substrate and the bonding pad. The first passivation layer above the bonding pad is patterned. Using the first passivation layer as a mask, a portion of the exposed metal pad material is removed. A patterned second passivation layer is formed over the first passivation layer. The second passivation layer has an opening that exposes the bonding pad. Finally, residual material from the first passivation layer inside the bonding pad region is removed to expose the bonding pad surface.

Since the bonding pad of this invention has a rugged surface profile, contact area of the bonding pad is increased. Hence, a conductive wire bonded to the bonding pad can have a higher adhesive strength resulting in a higher production yield.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
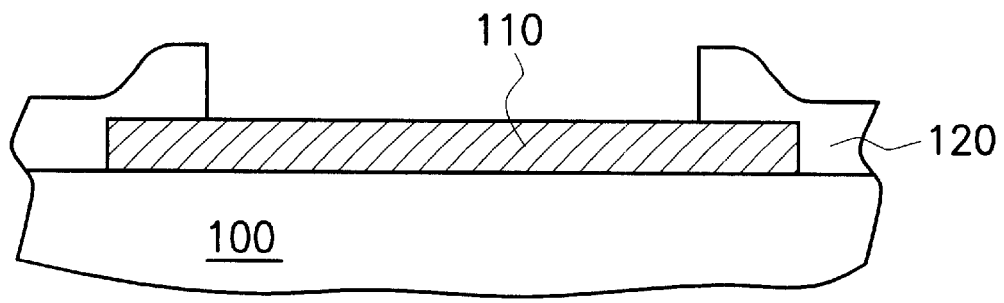
FIG. 1A is a cross-sectional side view of a conventional bonding pad.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the progression of steps for producing a bonding pad structure according to one preferred embodiment of this invention.

Figure 2A:
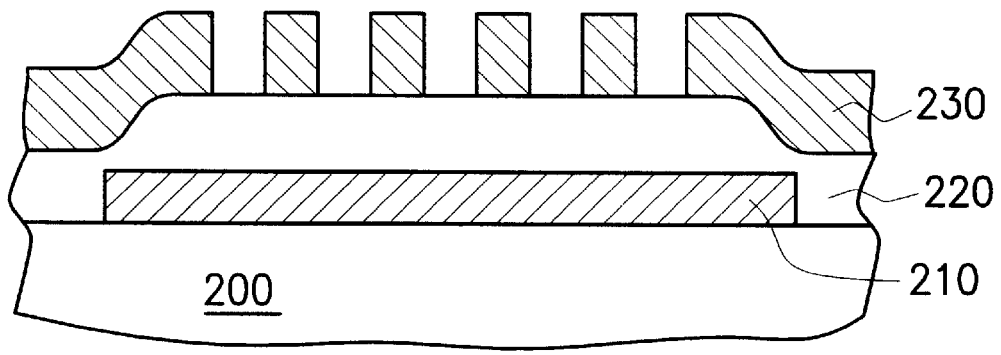
FIGS. 2A through 2E are schematic cross-sectional views showing the progression of steps for producing a bonding pad structure according to one preferred embodiment of this invention.

First, as shown in FIG. 2A, a substrate 200 is provided. A metallic bonding pad 210 is formed over the substrate 200, and then a passivation layer 220 is formed over the substrate 200 and the bonding pad 210. A patterned photoresist layer 230 is formed over the passivation layer 220. The patterned photoresist layer 230 has a plurality of openings above the bonding pad 210. The metallic bonding pad 210 can be, for example, a layer of aluminum/copper alloy having a thickness of between 3000 Å and 8000 Å, for example. The passivation layer 220 can be a silicon nitride layer having a thickness of between 4000 Å and 8000 Å or an oxide layer having a thickness of between 2000 Å and 8000 Å, or, as usual, a silicon nitride plus silicon oxide layer, for example.

Figure 2B:
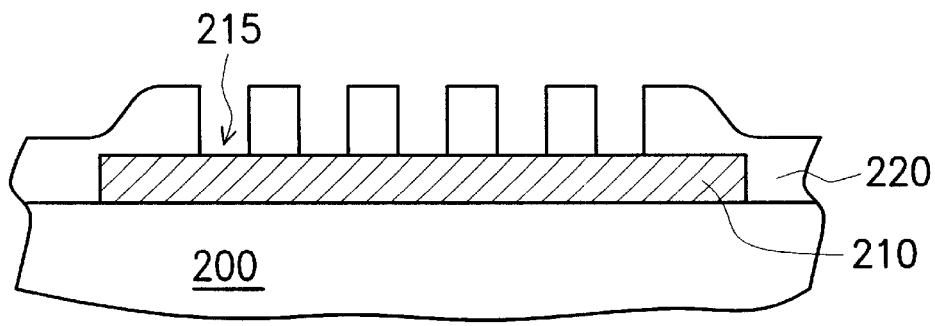

As shown in FIG. 2B, an anisotropic etching is conducted to form a plurality of openings 215 in the passivation layer 220 while using the photoresist layer 230 as a mask. The photoresist layer 230 is subsequently removed. Since the cross-sectional profile of the etched passivation layer 220 is relatively unimportant, the passivation layer 220 can also be isotropically etched in order to save time as long as undercutting is not serious.

Figure 2C:
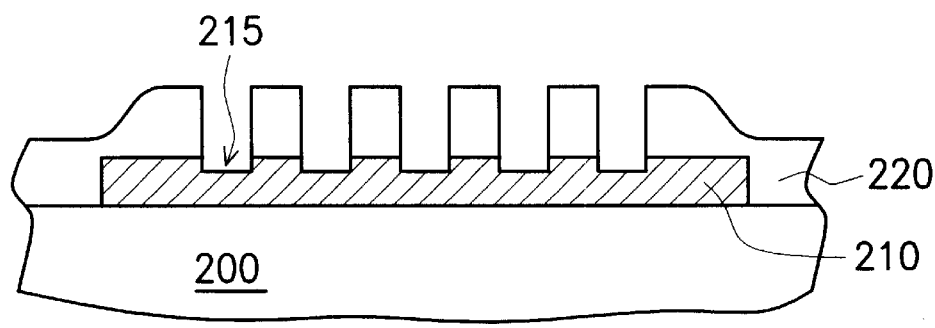

As shown in FIG. 2C, an anisotropic etching is again conducted to remove a portion of the bonding pad material exposed by the openings 215 while using the passivation layer 220 as a mask. Ultimately, a plurality of grooves or cavities 215 is formed in the upper surface of the bonding pad 210. In other words, a pattern is formed over the bonding pad 210. Similarly, since the cross-sectional profile (the cross-sectional profile of the cavities 215) of the etched bonding pad 210 is relatively unimportant, the passivation layer 220 can also be isotropically etched in order to save time.

Figure 2D:
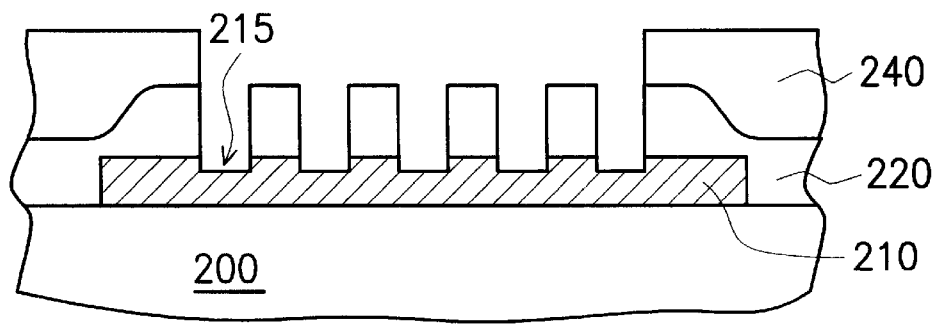

As shown in FIG. 2D, a second patterned passivation layer 240 is formed over the first passivation layer. The second passivation layer 240 has an opening above the metallic bonding pad 210 that exposes the residual passivation material of the passivation layer 220 and a portion of the metallic bonding pad 210. The second passivation layer 240 can be a layer of polyimide patterned, for example, by a conventional photolithographic method. Alternatively, the patterned polyimide layer is formed by depositing a photosensitive polyimide precursor over the substrate 200, followed by a light exposure, a chemical development and a curing operation.

Figure 2E:
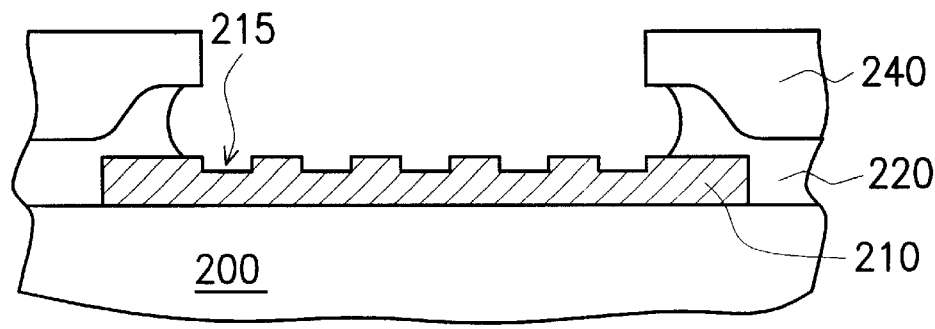

As shown in FIG. 2E, an isotropic etching is conducted to remove the residual passivation layer 220 on the metallic bonding pad 210 so that the upper surface of the bonding pad 210 is entirely exposed. An anisotropic etching can also be used to remove the residual passivation layer 220. Here, an isotropic etching is used because less time is needed to complete the operation.

Figure 2F:
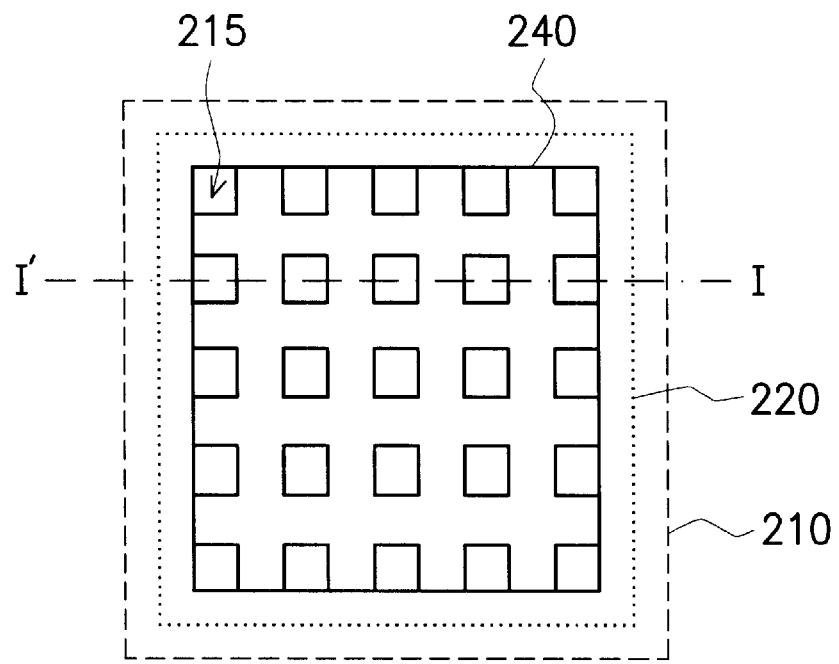
FIGS. 2F and 2G are top views of FIG. 2E showing two different patterns on the surface of the metallic bonding pads.
Figure 2G:
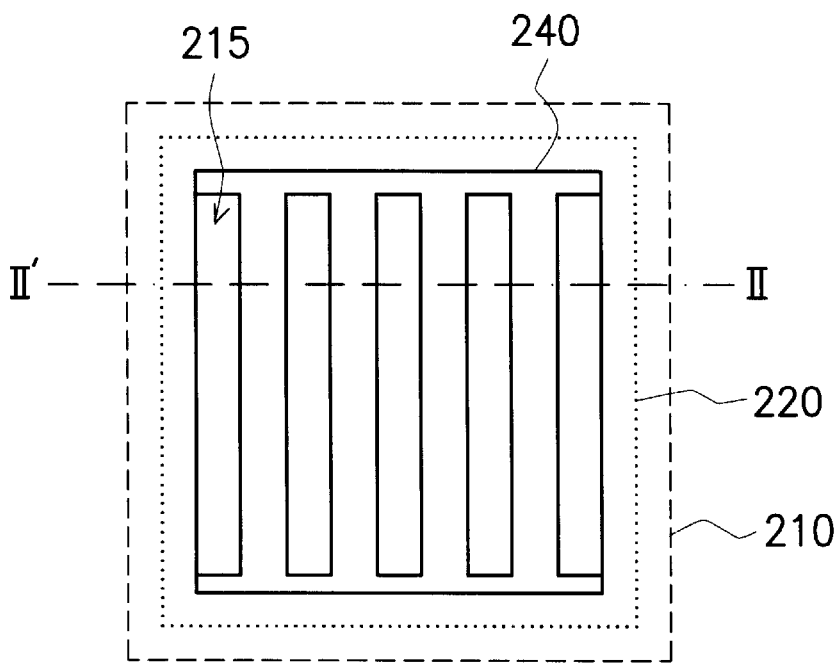

FIGS. 2F and 2G are top views of FIG. 2E showing two different patterns on the surface of the metallic bonding pads. In FIGS. 2F and 2G, the square enclosed by solid lines represents the interior edges of the passivation layer 240, the square enclosed by dotted lines represents the interior edges of the passivation layer 220 and the square enclosed by dash lines represents the exterior edges of the metallic bonding pads 210. The bonding pad 210 is patterned into an array of separate square-shaped islands as shown in FIG. 2F. A cross-sectional view along line A—A of FIG. 2F is that of FIG. 2E. On the other hand, the bonding pad may be patterned into a series of parallel strips as shown in FIG. 2G. A cross-section along line B—B of FIG. 2G is identical to the cross-section along line A—A of FIG. 2F.

Figure 1B:
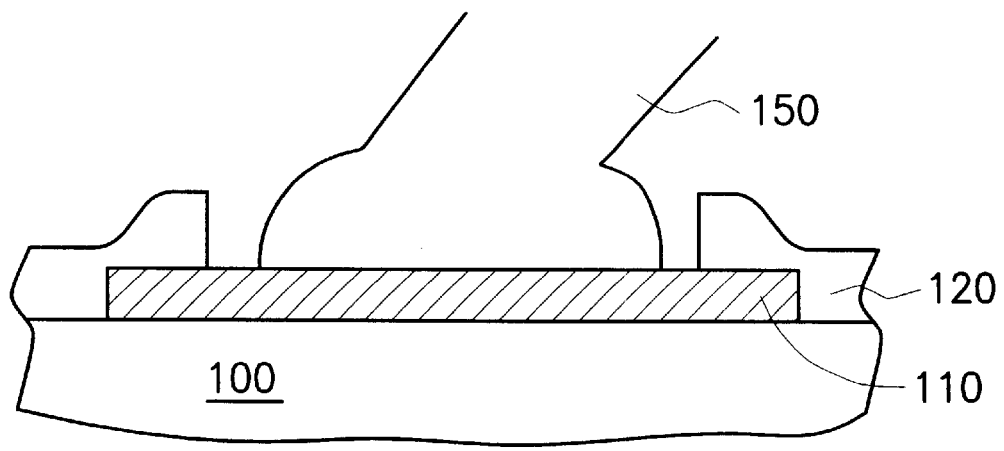
FIG. 1B is a cross-sectional side view of a conventional bonding pad with a bonding wire attached to the bonding pad surface.
Figure 3:
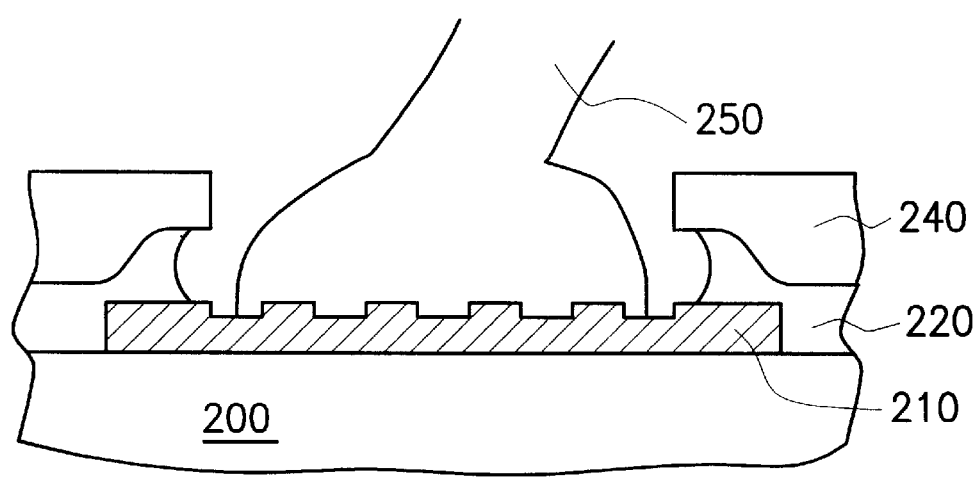
FIG. 3 is a cross-sectional view showing the metallic bonding pad of this invention with an attached conductive wire.

FIG. 3 is a cross-sectional view showing the metallic bonding pad of this invention with an attached conductive wire. When compared with a similarly attached conductive wire to a conventionally fabricated bonding pad in FIG. 1B, contact area between the conductive wire 250 and the metallic bonding pad 210 in FIG. 3 is greater.

By forming an uneven pattern on the upper surface of a bonding pad, effective contact area with a conductive wire is increased. Hence, a bonded wire is attached more firmly to the bonding pad and production yield is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a bonding pad structure on a substrate, comprising the steps of:

forming a metallic bonding pad over the substrate;

forming a first passivation layer over the substrate and the metallic bonding pad;

patterning the first passivation layer to form a plurality of openings above the metallic bonding pad;

removing a portion of exposed bonding pad material to form a pattern with a plurality of recesses on the metallic bonding pad while using the first passivation layer as a mask;

forming a patterned second passivation layer above the first passivation layer, wherein the second passivation layer has an opening above the metallic bonding pad; and removing any residual first passivation layer above the metallic bonding pad so that an entire bonding pad surface is exposed.

2. The method of claim 1, wherein the step of removing a portion of the metallic bonding material includes etching away a total thickness of between 1000 Å and 3000 Å from the bonding pad layer.

3. The method of claim 1, wherein the metallic bonding pad has a total thickness of between 3000 Å and 8000 Å.

4. A method of forming a bonding pad structure on a substrate, comprising the steps of:

forming a metallic bonding pad over the substrate;

forming a first passivation layer over the substrate and the metallic bonding pad;

patterning the first passivation layer to form a plurality of openings above the metallic bonding pad;

removing a portion of exposed bonding pad material to form a separate-island-block-array pattern on the metallic bonding pad while using the first passivation layer as a mask;

forming a patterned second passivation layer above the first passivation layer, wherein the second passivation layer has an opening above the metallic bonding pad; and removing any residual first passivation layer above the metallic bonding pad so that an entire bonding pad surface is exposed.

5. The method of claim 4, wherein the step of patterning the metallic bonding pad includes forming an array of parallel strips.

6. The method of claim 1, wherein the step of removing a portion of the bonding pad material includes isotropic etching or anisotropic etching.

7. The method of claim 1, wherein the step of removing residual first passivation layer above the bonding pad includes isotropic etching.

8. The method of claim 1, wherein the step of forming the first passivation layer includes depositing oxide.

9. The method of claim 8, wherein the oxide layer has a thickness of between 2000 Å and 8000 Å.

10. The method of claim 4, wherein the step of forming the first passivation layer includes depositing nitride.

11. The method of claim 10, wherein the nitride layer has a thickness of between 4000 Å and 8000 Å.

12. The method of claim 4, wherein the step of forming the second passivation layer includes depositing polyimide.

13. A bonding pad structure on a substrate, comprising:

a metallic bonding pad having a patterned with a plurality of recesses a top surface;

a first passivation layer over the substrate having an opening over the metallic bonding pad; and a second passivation layer above the first passivation also having an opening above the metallic bonding pad.

14. The structure of claim 13, wherein a difference in height level of the patterned bonding pad surface is between 1000 Å and 3000 Å.

15. The structure of claim 13, wherein the metallic bonding pad has a thickness of between 3000 Å and 8000 Å.

16. A bonding pad structure on a substrate, comprising:
- a metallic bonding pad having a patterned top surface, wherein a pattern of the patterned top surface includes an array of separate island blocks;
- a first passivation layer over the substrate having an opening over the metallic bonding pad; and
- a second passivation layer above the first passivation also having an opening above the metallic bonding pad.

17. The structure of claim 16, wherein the patterned metallic bonding pad includes an array of parallel strips.

18. The structure of claim 13, wherein the first passivation layer includes an oxide layer.

19. The structure of claim 16, wherein the first passivation layer includes a nitride layer.

20. The structure of claim 16, wherein the second passivation layer includes a polyimide layer.

* * * * *